(12) United States Patent
McMillin et al.

(10) Patent No.: US 6,908,846 B2
(45) Date of Patent: Jun. 21, 2005

(54) METHOD AND APPARATUS FOR DETECTING ENDPOINT DURING PLASMA ETCHING OF THIN FILMS

(75) Inventors: Brian K. McMillin, Fremont, CA (US); Eric Hudson, Berkeley, CA (US); Jeffrey Marks, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/401,114

(22) Filed: Mar. 27, 2003

(65) Prior Publication Data

US 2004/0080050 A1 Apr. 29, 2004

Related U.S. Application Data

(60) Provisional application No. 60/421,422, filed on Oct. 24, 2002.

(51) Int. Cl.[7] .................. H01L 21/4763; H01L 21/302; H01L 23/48
(52) U.S. Cl. ....................... 438/622; 438/623; 438/624; 438/710; 438/717; 438/723; 257/758; 257/760
(58) Field of Search ................................ 438/622–624, 438/14, 710, 714, 717, 723; 257/758–760

(56) References Cited

U.S. PATENT DOCUMENTS

| | | | |
|---|---|---|---|
| 4,675,072 A | | 6/1987 | Bennett et al. |
| 5,963,336 A | * | 10/1999 | McAndrew et al. ........ 356/437 |
| 5,966,586 A | | 10/1999 | Hao |
| 6,054,333 A | | 4/2000 | Bensaoula |
| 6,143,667 A | * | 11/2000 | Marsh ......................... 438/740 |
| 6,214,734 B1 | * | 4/2001 | Bothra et al. ................ 438/692 |
| 6,297,064 B1 | * | 10/2001 | Koshimizu ...................... 438/9 |
| 6,406,924 B1 | * | 6/2002 | Grimbergen et al. .......... 438/9 |
| 6,449,038 B1 | * | 9/2002 | Stolze ........................ 356/316 |
| 6,635,573 B2 | * | 10/2003 | Pau et al. .................... 438/689 |
| 6,649,253 B1 | * | 11/2003 | Bothra et al. ................ 428/209 |
| 2001/0030369 A1 | | 10/2001 | MacNeil et al. |
| 2002/0048019 A1 | | 4/2002 | Sui et al. |
| 2002/0090833 A1 | | 7/2002 | Matsuura |
| 2002/0102856 A1 | | 8/2002 | Xia et al. |

FOREIGN PATENT DOCUMENTS

| | | |
|---|---|---|
| JP | 62274726 | 11/1987 |
| JP | 2000228397 | 8/2000 |
| WO | WO 00/20900 | 4/2000 |
| WO | WO 01/71776 A2 | 9/2001 |

OTHER PUBLICATIONS

Benson et al., "Sensor Systems for Real–time Feedback Control of Reactive Ion Etching", (1996) J. Vac. Sci. Tech. B 14(1), pp. 483–488.

Chou, "Diode–Laser Absorption Spectroscopy of Hydrogen Halides for Semiconductor Plasma Process Diagnostics" (Jul. 2000) Mechanical Eng. Dept, Stanford Univ, Stanford, CA, pp. 26–39 & 78–81.

(Continued)

*Primary Examiner*—T. N. Quach
(74) *Attorney, Agent, or Firm*—IP Strategy Group PC (57) ABSTRACT

A method for controlling a plasma etch process while etching a layer stack having a first layer disposed above an end-point generating layer is disclosed. The method includes etching through the first layer and at least partially through the end-point generating layer while monitoring an absorption rate of a light beam traversing an interior portion of the plasma processing chamber, wherein the end-point generating layer is selected from a material that produces a detectable change in the absorption rate when etched. The end-point generating layer is characterized by at least one of a first characteristic and a second characteristic. The first characteristic is an insufficient thickness to function as an etch stop layer, and the second characteristic is an insufficient selectivity to etchants employed to etch through the first layer to function as the etch stop layer. The method additionally includes generating an end-point signal upon detecting the detectable change.

90 Claims, 6 Drawing Sheets

OTHER PUBLICATIONS

Cooper et al., "Near–infrared diode lasers monitor molecular species", Nov. 1992) Laser Focus World, pp. 133–146.

Kim et al., "In–situ UV Absorption $CF_2$ Sensor for Reactive Ion Etch Process Control", (May 1999) Proceedings of the SPIE—Int'l Soc. For Optical Eng., vol. 3742, pp. 136–143.

Maruyamat et al., "Measurement of the $CF_2$ radical using infrared diode laser absorption spectroscopy", (1993) J. Phys. D: Appl. Phys. vol. 26, pp. 199–202.

Oh et al., "In situ diode laser absorption measurements of plasma species in a gaseous electronics conference reference call reactor", (May/Jun. 1995) J. Vac. Sci. Tech. B vol. 13(3), pp. 954–961.

Richards et al., "Atomic Chlorine concentration measurements in a plasma etching reactor. I. A comparison of infrared absorption and optical emission actinometry", (Aug. 1987) J. Appl. Phys. vol. 62(3), pp. 792–798.

Richards et al., "Atomic Chlorine concentration measurements in a plasma etching reactor. II. A simple predictive model", (Aug. 1987) J. Appl. Phys. vol. 62(3), pp. 799–807.

Stanton, "A Measurement of the Radiative Lifetime of $Cl(3p^5\ ^2P_{1/2})$", (Dec. 1985) Chemical Physics Letters vol. 122, No. 4, North Holland Physics Publ. Div., pp. 385–390.

Stanton et al., "Direct absorption measurement of the spin–orbit splitting and $^2P_{1/2}$ radiative lifetime in atomic fluorine $(2p^5)$", (Jun. 1980) J. Chem. Phys. vol. 72(12), pp. 6637–6641.

Sun et al., "Combined wavelength and frequency modulation spectroscopy: a novel diagnostic tool for materials processing", (Feb. 1993) Applied Optics, vol. 32, No. 6, pp. 885–893.

Sun et al., "Measurements of neutral species in low pressure $C_2F_6$ discharges using diode laser absorption spectroscopy", (Jul./Aug. 1993) J. Vac. Sci. Tech. A, vol. 11(4), pp. 1193–1198.

Sun et al., "Novel étalon fringe rejection technique for laser absorption spectroscopy", (Aug. 1992) Applied Optics, vol. 31, No. 24, pp. 4998–5002.

Sun et al., "Real–time *in situ* detection of $SF_6$ in a plasma reactor", (Aug. 1993) Appl. Phys. Lett. vol. 63(8), pp. 1035–1037.

Sun et al., "Sensitive Plasma etching endpoint detection using tunable diode laser absorption spectroscopy", (May 1994) Appl. Phys. Lett. vol. 64(21), pp. 2779–2781.

Takahashi et al., "Control of Fluorocarbon Radicals by On–Off Modulated Electron Cyclotron Resonance Plasma", (Aug. 1993) Jpn. J. Appl. Phys. vol. 32, pp. 1088–1091.

Takahashi et al., "Measurements of the CF, $CF_2$ and $CF_3$ Radicals in a CHF3 Electron Cyclotron Resonance Plasma", (May 1993) Jpn. J. Appl. Phys. vol. 32, pp. L694–L697.

Magane et al., "Measurements of the CF Radical in DC Pulsed $CF_4/H_2$ Discharge Plasma Using Infrared Diode Laser Absorption Spectroscopy", (May 1990) Jpn. J. Appl. Phys., vol. 29, No. 5, pp. L829–L832.

Wormhoudt et al., "Atomic chlorine concentration and gas temperature measurements in a plasma etching reactor", (Jan. 1987) J. Appl. Phys. vol. 61(1), pp. 142–148.

Wormhoudt, "Radical and molecular product concentration measurements in CF4 and CH4 radio frequency plasmas by infrared tunable diode laser absorption", (May/Jun. 1990) J. Vac. Sci. Tech., pp. 1722–1725.

"LaserMax inc.—The Diode Laser Solution", Internet download, (Rochester, NY) 14 pp.

Richter et al., "Exhaust gas monitoring: New window into semiconductor processing" (May 1999) Solid State Technology, Cowan Publ. Corp, Washington, US, pp. 61, 63–64, 66, 68, 70–71.

International Search Report, mailed Jul. 8, 2004, Int'l Appl. No. PCT/US03/33706, EPO.

* cited by examiner

METHOD AND APPARATUS FOR DETECTING ENDPOINT DURING PLASMA ETCHING OF THIN FILMS

CROSS-REFERENCE TO RELATED APPLICATIONS

This application claims priority from U.S. Provisional Application No. 60/421,422 entitled "Method and Apparatus for Absorption Endpoint Detection During Plasma Etch" by inventors Brian K. McMillin, Eric Hudson, and Jeff Marks which is incorporated herein by reference.

BACKGROUND OF THE INVENTION

The invention relates generally to methods for monitoring and controlling processes used in fabricating integrated circuit devices. More specifically, the invention relates to a method for detecting an endpoint during plasma etching of a film stack, such as a dielectric film stack.

In the fabrication of integrated circuits, features may be etched into film stacks and filled with different materials to form the desired circuitry. To facilitate ease of understanding, the disclosure herein will focus on dual damascene integration as one exemplary technique involving the etching of a film stack. It should be understood, however, that the techniques disclosed herein are not limited only to dual damascene integration and may apply to the etching of any film stack wherein an endpoint is required.

Generally speaking, dual damascene integration is used to form high-speed wiring interconnects in complex integrated circuit devices. In dual damascene integration, trenches and vias are formed in a low-permittivity (low-κ) material, such as a fluorosilicate glass (FSG), an organosilicate glass (OSG), e.g., BLACK DIAMOND or CORAL, or a spin-on organic (SOO), e.g., SILK or FLARE, and filled with copper or another suitable conductor. The copper is used to reduce the resistance of the metal interconnect lines, and the low-κ material is used to reduce parasitic capacitance between the metal interconnects.

Figure 1A:
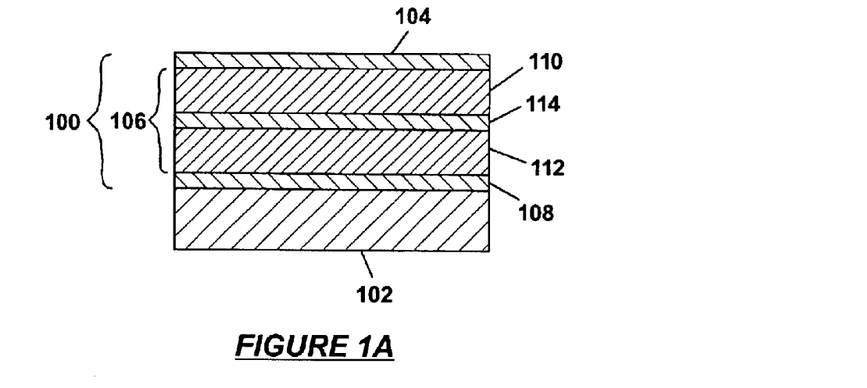
FIG. 1A shows a dual-damascene stack prior to forming a trench and a via.

FIG. 1A shows a dual damascene stack 100 formed on a copper line 102. In general, a dual-damascene stack is made of a sequence of hard masks and interlayer dielectrics. In the discussions that follow, terms such as "above" and "below," which may be employed herein to discuss the spatial relationship among the layers, may, but need not always, denote a direct contact between the layers involved. It should be noted that other additional layers above, below, or between the layers shown or discussed may be present. Further, not all of the shown or discussed layers need necessarily be present and some or all may be substituted by other different layers.

For example, the dual damascene stack 100 includes a top hard mask 104, a dielectric film stack 106, and a diffusion barrier 108. The dielectric film stack 106 includes low-κ interlayer dielectrics 110, 112 and an embedded hard mask 114. The top hard mask 104 protects the interlayer dielectric 110 from chemicals used in photoresist stripping processes and may be omitted depending on the target application. The diffusion barrier 108 prevents undesirable diffusion of atoms between the copper 102 and the interlayer dielectric 112. The embedded hard mask 114 and diffusion barrier 108 act as etch stop layers for the trench and via etches, respectively.

There are two main approaches to dual-damascene integration: a trench-first approach and a via-first approach. In the trench-first approach, a via is patterned and etched in the dual-damascene stack 100 after a trench is formed in the stack 100. In the via-first approach, a trench is patterned and etched in the dual-damascene stack 100 after a via is formed in the stack 100. A less common approach to dual-damascene integration, called buried-via or self-aligned damascene process, involves patterning the embedded hard mask 114 prior to depositing the interlayer dielectric 110 and top hard mask 104 and etching the trench and via in the stack 100 in one step.

Figure 1B:
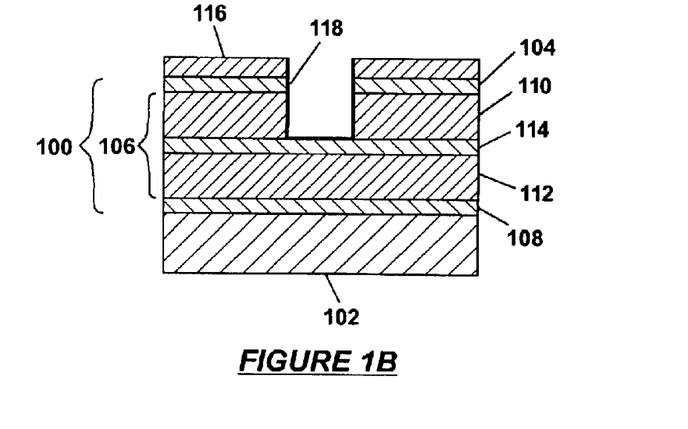
FIG. 1B shows a trench formed in the dual-damascene stack of FIG. 1A.
Figure 1C:
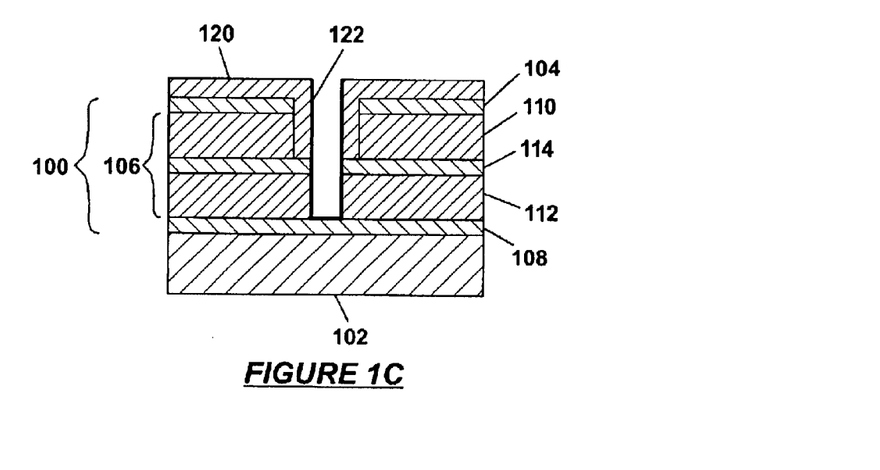
FIG. 1C shows a via formed in the dual-damascene stack of FIG. 1B.
Figure 1D:
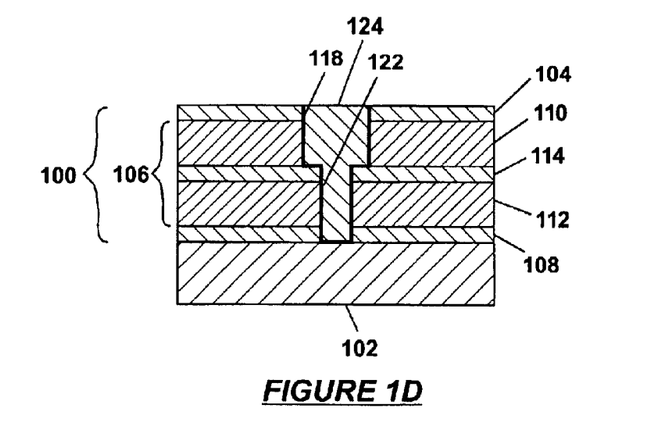
FIG. 1D shows the trench and via of FIGS. 1B and 1C, respectively, filled with copper.

FIGS. 1B–1D illustrate an exemplary trench-first dual-damascene process. In FIG. 1B, a photoresist mask 116 having a trench pattern is applied on the top hard mask 104. A trench 118 is formed in the stack 100 by etching the trench mask 116 through the top hard mask 104 and through the interlayer dielectric 110, stopping on the embedded hard mask 114. In FIG. 1C, the trench mask (116 in FIG. 1B) has been stripped off, and a photoresist mask 120 having a via pattern is applied on the top hard mask 104 and the exposed embedded hard mask 114. A via 122 is formed in the stack 100 by etching the via mask 120 through the etch stop layer 114 and interlayer dielectric 112, stopping on the diffusion barrier 108.

Figure 1E:
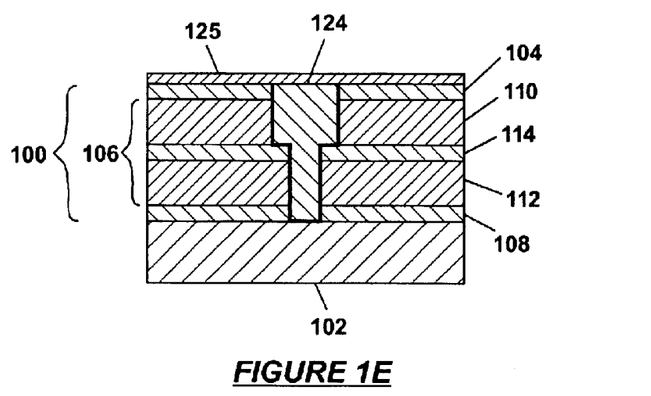
FIG. 1E shows a blanket of diffusion barrier deposited on the stack of FIG. 1D to cap the copper.

In FIG. 1D, the exposed diffusion barrier 108 has been opened up via an etch process, and the via mask (120 in FIG. 1C) has been stripped off. Copper 124 is deposited into the trench 118 and the via 122 and polished back to the surface of the trench 118. The trench 118 and via 122 are typically lined with a material such as tantalum to prevent copper from diffusing into the interlayer dielectrics 110, 112. In FIG. 1E, a blanket of diffusion barrier 125 is deposited on the stack 100 to cap the copper 124.

Figure 1F:
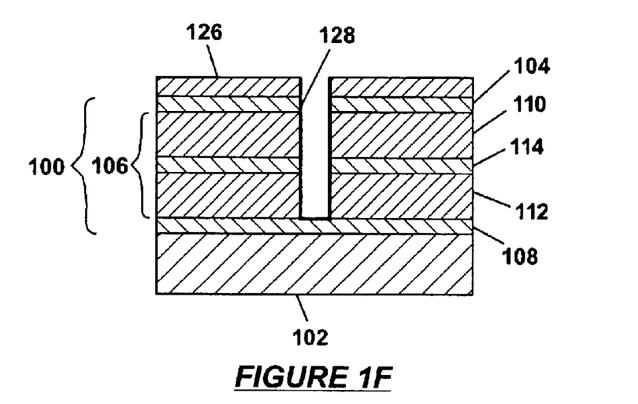
FIG. 1F shows a via formed in the dual-damascene stack of FIG. 1A.
Figure 1G:
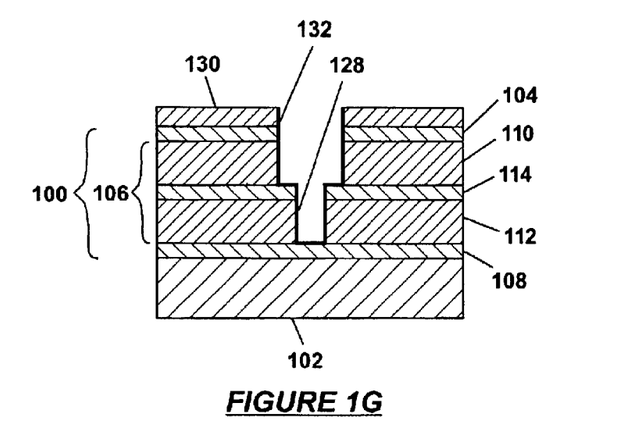
FIG. 1G shows a trench formed in the dual-damascene stack of FIG. 1F.

FIGS. 1F–1I illustrate a via-first dual-damascene process. In FIG. 1F, a photoresist mask 126 having a via pattern is applied on the top hard mask 104. A via 128 is formed in the stack 100 by etching the via mask 126 through the top hard mask 104, the interlayer dielectric 110, the embedded hard mask 114, and the interlayer dielectric 112, stopping on the diffusion barrier 108. In FIG. 1G, the photoresist mask (126 in FIG. 1F) has been stripped off, and a photoresist mask 130 having a trench pattern is applied on the top hard mask 104. A trench 132 is formed in the stack 100 by etching the trench mask 130 through the top hard mask 104 and the interlayer dielectric 110, stopping on the embedded hard mask 114.

Figure 1H:
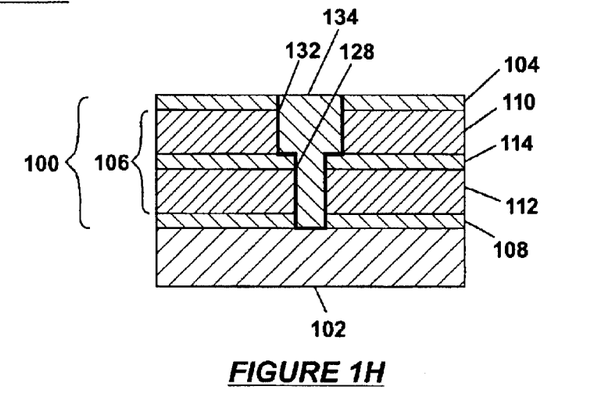
FIG. 1H shows the via and trench of FIGS. 1F and 1G, respectively, filled with copper.
Figure 1I:
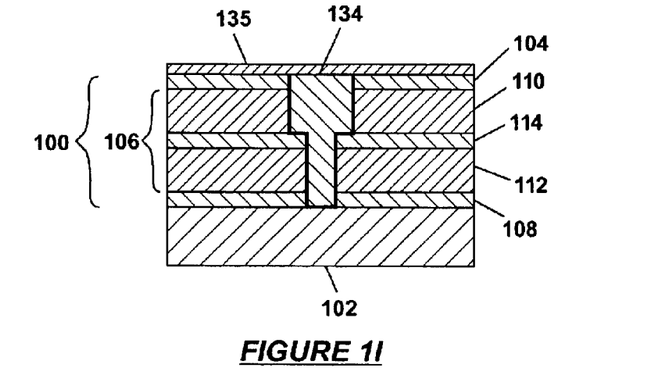
FIG. 1I shows a blanket of diffusion barrier deposited on the stack of FIG. 1H to cap the copper.

In FIG. 1H, the exposed bottom hard mask 114 has been opened up via an etch process, and the trench mask (130 in FIG. 1G) has been stripped off. Copper 134 is deposited into the via 128 and trench 132 and polished back to the surface of trench 132. The via 128 and trench 132 are typically lined with a material such as tantalum to prevent copper from diffusing into the interlayer dielectrics 110, 112. In FIG. 1I, a blanket of diffusion barrier 135 is deposited on the stack 100 to cap the copper 134.

In a trench etch, for example, the embedded hard mask 114 typically remains in the dielectric film stack 106r. When used as an etch stop layer, the embedded hard mask 114 is required to have selectivity to etching, which typically means that the embedded hard mask 114 has a significantly slower etch rate compared to the interlayer dielectric 110. Commonly, materials used as etch stop layers, such as $SiN_x$ or SiC, tend to have a high permittivity (κ) value relative to the low-κ interlayer dielectrics, which raises the overall κ value of the dielectric film stack 106. An increase in the overall κ value of the dielectric film stack 106 results in an increase in parasitic capacitance and compromises the ability of the stack to mitigate electrical delays. Thus, it is desirable to eliminate the high-κ embedded hard mask 114 or, at least, reduce its contribution to parasitic capacitance.

However, control of etching is difficult when there is no effective etch stop layer.

One method for controlling etching when there is no effective etch stop layer is timed-etch. However, timed-etch may have a very low yield because it does not account for incoming material variations, e.g., variations in film thicknesses from one stack to the next, differences in etch rates as a result of material composition, and differences in etch rates of substantially identical etch systems.

Single or multiple discrete wavelength interferometry is an example of an optical diagnostic method that does not require an etch stop layer to detect an endpoint in an etching process. In single-wavelength interferometry, a light beam is directed on the surface of the wafer. The reflected signals from the wafer then combine constructively or destructively to produce a periodic interference fringe. When a predetermined number of fringes corresponding to the thickness of material to be removed has been counted, the etching process is stopped. In general, strong reflections from the interfaces (or underlying metal features) in a dual-damascene structure make it difficult to use the interferometric approach for detecting an etching endpoint. Further, the interferometric approach has limited capability to account for incoming material variations because it measures relative changes in feature dimensions as opposed to absolute feature dimensions.

From the foregoing, there is desired a method for detecting an endpoint during etching of a film stack without significantly increasing the overall κ value of the film stack.

SUMMARY OF THE INVENTION

The invention relates, in one embodiment, to a method for controlling a plasma etch process in a plasma processing chamber. The method includes introducing a substrate having thereon a layer stack into the plasma processing chamber, the layer stack including a first layer disposed above an endpoint generating layer. The method also includes etching through the first layer and at least partially through the endpoint generating layer while monitoring an absorption rate of a light beam traversing an interior portion of the plasma processing chamber, wherein the endpoint generating layer is selected from a material that produces a detectable change in the absorption rate when etched. The endpoint generating layer is characterized by at least one of a first characteristic and a second characteristic. The first characteristic is an insufficient thickness to function as an etch stop layer for the etching, and the second characteristic is an insufficient selectivity to etchants employed to etch through the first layer to function as the etch stop layer. The method additionally includes generating an endpoint signal upon detecting the detectable change.

In another embodiment, the invention relates to a substrate configured to be etched in a plasma processing chamber. The substrate includes a first layer, and an endpoint generating layer disposed below the first layer. The endpoint generating layer is selected from a material that produces a detectable change in an absorption rate of a light beam traversing the plasma processing chamber when the endpoint generating layer is etched. The endpoint generating layer is characterized by an insufficient thickness/selectivity combination to function as an etch stop layer for a plasma etch that also etches through the first layer.

In yet another embodiment, the invention relates to a method, in a plasma processing chamber, or etching through a low-κ layer of a layer stack, the low-κ layer being disposed above an endpoint generating layer. The method includes introducing a substrate having thereon the layer stack into the plasma processing chamber. The method further includes generating a light beam that traverses an interior portion of the plasma processing chamber. The method additionally includes etching through the layer stack, including the low-κ layer, while monitoring an absorption rate of the light beam by a direct absorption measurement technique, wherein the endpoint generating layer is selected from a material that produces a detectable change in the absorption rate when etched. The endpoint generating layer is characterized by an insufficient thickness/selectivity combination to function as an etch stop layer for the etching. The method further includes generating an endpoint signal upon detecting the detectable change.

These and other features and advantages of the invention will be discussed in more detail in the following detailed description of the invention and in conjunction with the following figures.

BRIEF DESCRIPTION OF THE DRAWINGS

The invention is illustrated by way of example, and not by way of limitation, in the figures accompanying the drawings, and in which like reference numerals refer to similar elements, and in which.

DETAILED DESCRIPTION OF THE PREFERRED EMBODIMENTS

The invention will now be described in detail with reference to a few preferred embodiments, as illustrated in the accompanying drawings. In the following description, numerous specific details are set forth in order to provide a thorough understanding of the invention. It will be apparent, however, to one skilled in the art, that the invention may be practiced without some or all of these specific details. In other instances, well-known process steps and/or features have not been described in detail in order to not unnecessarily obscure the invention. The features and advantages of the invention may be better understood with reference to the drawings and discussions that follow.

In accordance with one aspect of the invention, there is provided with the film stack an endpoint generating layer. Unlike the etch stop layer of the prior art, the endpoint generating layer does not have to have the requisite selectivity or thickness to stop the etching. In fact, since the reduction of parasitic capacitance is an important consideration for the use of the low-κ dielectric material, the endpoint generating layer may be selected from materials having a lower κ value, the same κ value, or a slightly higher κ value without consideration for etch selectivity and thickness requirements to stop the etch.

In one embodiment of the present invention, the endpoint generating layer may have the same chemical composition but with slightly different stoichiometry than that of the layer being etched. The stoichiometry only needs to be different enough to trigger a signal by the detection equipment when the etch reaches the endpoint generating layer. In another embodiment of the present invention, the endpoint generating layer may have the same chemical composition but enriched with one or more isotopes. The isotope type and isotope dopant concentration are selected to be at least sufficient to trigger a signal by the detection equipment when the etch reaches the endpoint generating layer. In another embodiment of the present invention, the endpoint generating layer may have a different chemical composition from those of the layer being etched. The difference in the chemical composition of the layers is such that the detection equipment is capable of detecting such difference to generate an endpoint signal when the etch reaches the endpoint generating layer.

Unlike the conventional etch stop layer, the endpoint-generating layer results in negligible and/or advantageously low perturbation in the overall κ value of the film stack or any other electrical and/or chemical properties of the film stack. In one embodiment, the detection of the etching of the endpoint generating layer is accomplished using direct absorption measurement techniques. In various embodiments of the invention, the detection may be performed using a single-pass configuration or a multi-pass configuration. In another embodiment of the invention, the detection of the etching of the endpoint generating layer is accomplished using frequency-modulated spectroscopy. In yet another embodiment, the detection of the etching of the endpoint generating layer is accomplished using wavelength-modulated spectroscopy. Detection of the etching of the endpoint generating layer may also be accomplished using electrical measurement techniques, optical emission spectroscopy (OES), or other absorption-based methods such as Fourier Transform Infrared Spectroscopy (FTIR), or cavity ring down techniques if such is capable of detecting the presence of the endpoint generating layer materials or their byproducts in the plasma.

Figure 2:
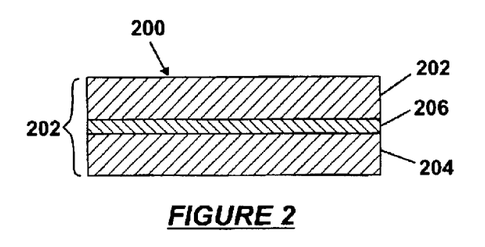
FIG. 2 shows a film stack including an endpoint-generating layer according to an embodiment of the invention.

The various embodiments of the present invention and their advantages may be better understood with reference to the exemplary drawings and discussions that follow. For illustration purposes, FIG. 2 shows a film stack 200 according to an embodiment of the invention. The film stack 200 includes film layers 202, 204. As an example, the film layers 202, 204 could be made of a low-κ material, such as a fluorosilicate glass (FSG), an organosilicate glass (OSG), or a spin-on organic (SOO). Examples of OSGs include BLACK DIAMOND and CORAL. Examples of SOOs include SILK and FLARE. In accordance with one embodiment of the invention, an endpoint-generating layer 206 is embedded in the film stack 200, e.g., between the film layers 202, 204, using, for example, a multi-recipe thin-film deposition process. For dual-damascene integration, the film stack 200 could be stacked on a copper line.

In one embodiment, the endpoint-generating layer 206 is a thin film having the same chemical composition as the film layers 202, 204 but a slightly different stoichiometry from the film layers 202, 204. Advantageously, only a slight difference in stoichiometry is needed (the exact degree of difference depends on the sensitivity of the detection technique and detection equipment employed) to avoid substantially modifying the electrical and/or chemical characteristic of the film stack 200. For example, the film layers 202, 204 and the endpoint-generating layer 206 could be made of an OSG having a $SiO_xC_yH_z$ composition, and the fraction of one or more of C, Si, O, and H can be increased in the endpoint-generating layer 206 to make layer 206 have a slightly different stoichiometry from the film layers 202, 204.

During plasma etching, the gas phase species monitored for the purpose of generating an endpoint signal would then depend on the chemical element(s) having a different relative proportion in the endpoint-generating layer 206 and the etchant gases. Typically, the etchant gases include oxygen and fluorine-containing gases. As an example, if the chemical element having a different relative proportion in the endpoint-generating layer 206 is C and/or H, then a change in the CO or HF plasma species concentration can be detected during etching and used to generate the endpoint signal. It should be noted that CO and HF may be observed in the plasma prior to etching the endpoint-generating layer 206, but a noticeable change in the concentration of the CO or HF plasma species would be observed when layer 202 is etched through or when endpoint-generating layer 206 is at least partially etched.

Thus, a change in concentration of a plasma species of interest, i.e., an etch byproduct, should occur when layer 202 is etched through or endpoint-generating layer 206 is etched. When this change in concentration is detected, an endpoint signal can be generated. As explained above, this change could be achieved by making the stoichiometry of the endpoint-generating layer 206 slightly different from the stoichiometry of the film layers 202 and/or 204.

In another embodiment of the invention, the endpoint-generating layer 206 is a thin film having the same chemical elements as the film layers 202, 204 but enriched with an isotope such that isotopic proportions of the element are substantially modified from the natural or typical proportions for that element. Note that the natural or typical level of the isotope chosen for enrichment may be zero or non-zero in the endpoint generating layer prior to enrichment. Preferably, the enriched isotope in the endpoint-generating layer 206 is compatible with the film layers, e.g., the isotope in the endpoint-generating layer 206 could be an isotope of a chemical element in the film layers 202, 204. For example, if the film layers 202, 204 and the endpoint-generating layer 206 are made of an OSG having $SiO_xC_yH_z$ composition, then one or more of the following isotopes could be enriched in the endpoint-generating layer 206: carbon-13 ($^{13}C$), deuterium ($^2H$ or D), oxygen-17 ($^{17}O$), oxygen-18 ($^{18}O$), silicon-29 ($^{29}Si$), and silicon-30 ($^{30}Si$).

During plasma etching, the gas phase species monitored for the purpose of generating an endpoint signal would then depend on the enriched isotope(s) included in the endpoint-generating layer 206 and the etchant gases. For example, if $^{13}$C and/or D is included in the endpoint-generating layer 206, then $^{13}$CO or DF would be monitored during etching of the endpoint-generating layer 206, and an endpoint signal could be generated when a change in the concentration of $^{13}$CO or DF is observed. It should be noted that CO and HF will be observed prior to etching the endpoint-generating layer 206, but a significant concentration of $^{13}$CO or DF would only be observed when the endpoint-generating layer 206 is etched.

In an alternate embodiment, instead of tagging the endpoint-generating layer 206 with an isotope, the film layer 202 overlying the endpoint-generating layer 206 or the film layer 204 underlying the endpoint-generating layer 206 is tagged or enriched with the isotope. In another embodiment, one of the layers (202 or 204) may be tagged or enriched with the isotope and the endpoint-generating layer 206 may be omitted altogether. As in the previous embodiments, the concentration of the plasma species of interest is monitored to determine when to generate an endpoint signal.

In another embodiment of the invention, the endpoint-generating layer 206 is a thin film having a different chemical composition from the film layers 202, 204. In general, the chemical composition of the endpoint-generating layer 206 is selected such that the overall chemistry of the film stack 200 is not substantially modified. As an example, the film layers 202, 204 and endpoint-generating layer 206 could all be made of a silicate material, while selecting the silicate material in the endpoint-generating layer 206 to be different from the silicate material in the film layers 202, 204.

As an example, if the film layers 202, 204 are both made of an OSG or a FSG, the endpoint-generating layer 206 could be made of borophosphosilicate glass (BPSG) or silicon dioxide formed from chemical vapor deposition of tetraethyl orthosilicate (TEOS). In the case of BPSG, the endpoint of the etch process could then be detected by monitoring the plasma for a change in concentration of BF, BH, PF, PH, BO, PO, or other B- and P-containing species. In the case of TEOS, the endpoint of the etch process could be detected by monitoring the plasma for a change in concentration of CO. If the film layers 202, 204 are made of an OSG, the endpoint-generating layer 206 could be made of a FSG, and the plasma could be monitored for a change in concentration of HF.

Table 1 below shows examples of endpoint-generating layers for different low-κ dielectric materials.

layers besides those listed in Table 1 are also possible. A general guideline for selecting a suitable endpoint-generating layer will now be discussed.

In general, the endpoint-generating layer 206 is selected to be compatible with the film layers 202, 204, i.e., the intention is not to significantly modify the chemical and/or electrical characteristic of the film stack 200. The κ value of the endpoint-generating layer 206 could be lower than, similar to, or slightly higher than the κ value of the thin-films 202, 204. In general, the lower the κ value of the endpoint-generating layer 206, the better.

The contribution of the endpoint-generating layer 206 to the overall κ value of the film stack 200 is a function of the κ value and thickness of the endpoint-generating layer 206. If the κ value of the endpoint-generating layer 206 is comparable to or lower than the κ value of the film layers 202, 204, the endpoint-generating layer 206 can be made relatively thick to ensure reliable endpoint detection without significantly increasing the overall κ value of the stack. However, if the κ value of the endpoint-generating layer 206 is higher than the κ value of the film layers 202, 204, the endpoint-generating layer 206 may have to be made relatively thin to limit its contribution to the overall κ value to a small value. Since the endpoint-generating layer 206 does not have to function as an etch stop layer (i.e., having the requisite selectivity or thickness to stop the etch), the endpoint-generating layer only has to be as thick as needed to trigger detection by the chosen detection technique/equipment.

It is important to stress again that the endpoint-generating layer 206 is not the same as an etch stop layer. For example, the endpoint-generating layer 206 is not required to have selectivity to etching while a conventional etch stop layer is required to have selectivity to etching. This aspect flexibly allows the endpoint-generating layer 206 to be selected to have a κ value that is similar to or lower than the κ value of the film layers 202, 204, which results in only a small or negligible perturbation in the overall κ value of the film stack 200.

Further, etching of a feature in the thin film 202 overlying the endpoint-generating layer 206 does not stop when the endpoint-generating layer 206 is exposed. Instead, the exposed endpoint-generating layer 206 may be completely removed before an endpoint signal is generated. This reduces the number of steps needed to form a feature. In the case of the conventional etch stop layer, the etching stops

TABLE 1

Examples of endpoint-generating layers for low-κ dielectric materials

ENDPOINT-GENERATING LAYER

| LOW-K DIELECTRIC MATERIAL | A<br>D tagged | B<br>$^{13}$C tagged | C<br>Modified stoichiometry | D<br>BPSG | E<br>FSG | F<br>TEOS | G<br>$^{17}$O or $^{18}$O tagged | H<br>$^{29}$Si or $^{30}$Si tagged |
|---|---|---|---|---|---|---|---|---|
| OSG | X | X | X | X | X | X | X | X |
| SOO | X | X | X |   |   |   | X |   |
| FSG |   |   | X | X |   | X | X | X |

Consistent with the principles of the invention, the endpoint-generating layers listed in Table 1 do not result in a significant change in the overall κ value of the film stack when embedded in the film stack. Other endpoint-generating when the etch stop layer is exposed. The exposed etch stop layer may need to be removed in a subsequent step.

The conventional etch stop layer is typically required to have sufficient thickness to compensate for over-etching. In the present invention, over-etching is not a concern. Actually, it is necessary to etch the exposed endpoint-generating layer 206 to create the detectable change in concentration of plasma species of interest, which is used to generate the endpoint signal. Because the endpoint-generating layer 206 is not required to compensate for over-etching, it can be made to be thinner than a conventional etch stop layer while still allowing generation of the endpoint signal.

The concentration of a plasma species, or an etch byproduct, depends on the combination of production and loss rates. The rate of production of a plasma species of interest will change as etching proceeds from the thin film 202 to the endpoint-generating layer 206. In a preferred embodiment, this change is determined by monitoring absorption of the plasma species of interest using one of several sensitive detection techniques, such as direct absorption, wavelength-modulation spectroscopy, frequency-modulation spectroscopy, FTIR, or cavity ring down methods. Although the sensitivity may be lower, optical emission spectroscopy may also be employed.

In general, absorption spectroscopy involves passing a light beam through the etching plasma. The wavelength of the light beam is chosen to be near one of the resonant absorption wavelengths of the plasma species of interest. A change in intensity of the light beam as a result of absorption by the plasma species of interest indicates a change in the concentration of the plasma species of interest. When this change is observed, an endpoint signal can be generated.

Figure 3A:
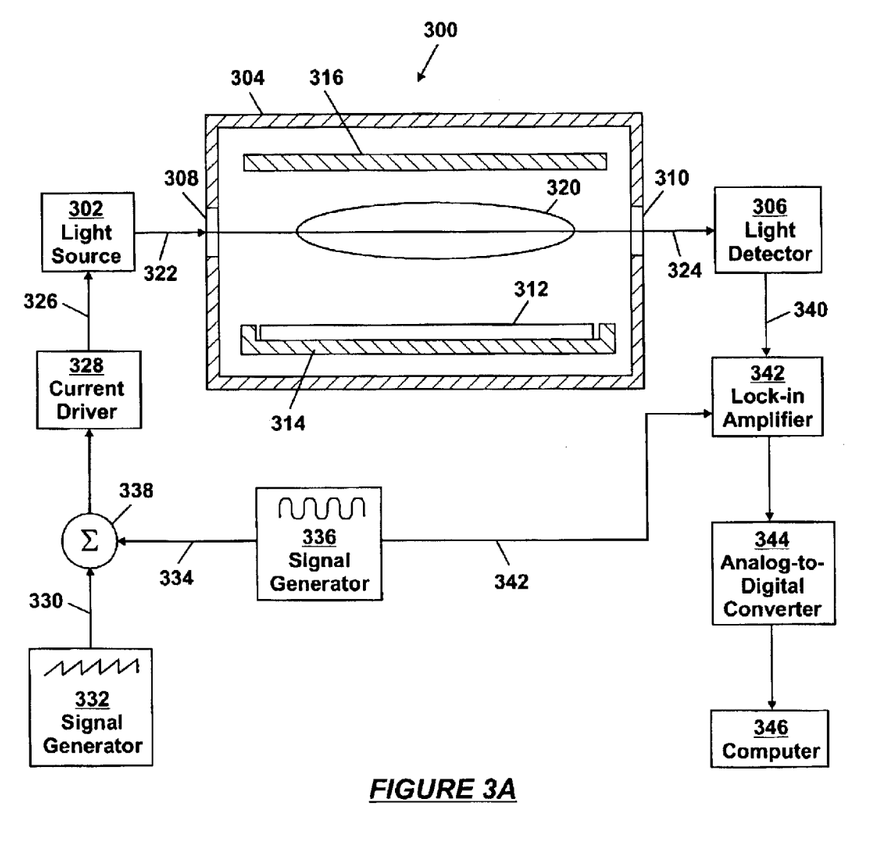
FIG. 3A is a schematic of an etch system equipped with a single-pass direct absorption measurement apparatus according to an embodiment of the invention.

FIG. 3A shows an etching system 300 suited for in-situ monitoring of plasma etching of a film stack according to an embodiment of the invention. Note that etching system 312 is only exemplary; the invention can be practiced in any plasma etcher, irrespective of the technology employed to ignite, sustain and/or control the plasma. The exemplary etching system 300 includes a light source 302, a reaction chamber 304, and a light detector 306. The reaction chamber 304 has diametrically-opposed windows 308, 310, which are optically transparent at a selected wavelength or wavelength range. A wafer 312 is mounted inside the reaction chamber 304, between electrodes 314, 316. The electrode 314 is energized by a RF supply (not shown), while the electrode 316 is grounded. In other embodiments, the top electrode 316 may be powered by an RF power source at the same or different RF frequency. Although FIG. 3A illustrates a capacitively coupled plasma reactor, the technique could be applied to other reactor types such as inductively coupled or microwave systems. The wafer 312 includes a film stack, such as a dielectric film stack, with an endpoint-generating layer, such as described above.

In operation, appropriate etchant gases (not shown) are supplied into the reaction chamber 304 and energized to form a plasma 320 above the wafer 312. In order to monitor in-situ a plasma species of interest, the light source 302 is controlled to direct a light beam 322 into the reaction chamber 304 through the window 308. Although not shown, an optical system, such as a system of collimating lenses or optical fiber, may be used to channel the light beam 322 from the light source 302 to the window 308. The light beam 322 passes through the plasma 320 before exiting the window 310. The wavelength of the light beam 322 is chosen to be near one of the absorption wavelengths of the plasma species of interest. As such, if the plasma species of interest is present in the reaction chamber 304, the light beam 322 may be partially absorbed after passing through the plasma 320. The transmitted beam, indicated at 324, is detected by the light detector 306.

In one embodiment, the light source 302 is a temperature-controlled laser diode capable of operating within the infrared, visible, and/or UV spectral regions. Several species of interest in plasma etching have absorption transitions in the near infrared, such as HF at 1.33 $\mu$m, CO at 1.567 $\mu$m, HCl at 1.747 $\mu$m, and $O_2$ at 0.761 $\mu$m. Other species such as CF, $CF_2$, and $CF_3$, for example, have fundamental transitions at longer wavelengths, but can be accessed in the near infrared by probing vibrational overtone transitions.

In one embodiment, the laser diode 302 generates a wavelength- or frequency-modulated laser beam. Frequency-modulated spectroscopy uses modulation frequencies comparable to or greater than the absorption linewidths, whereas wavelength-modulated spectroscopy uses modulation frequencies much smaller than the absorption linewidths. The laser drive current 326 may be generated by a low-noise current driver 328 acting in response to a superposition of an input sawtooth waveform 330 (at, e.g., 100 Hz) generated by a signal generator 332 and an input sinusoidal waveform 334 (at, e.g., 50 KHz) generated by a signal generator 336. The waveforms 330, 334 are summed by a circuit 338 before being input to the current driver 328.

The DC magnitude of the laser drive current 326 and the laser temperature, which is typically near room temperature, e.g., in a range from 0–50° C., determine the initial laser wavelength for the scan. The sawtooth component scans the laser wavelength through the absorption transition. The sinusoidal modulation facilitates use of phase-sensitive detection of the beam absorption. The laser wavelength is chosen to be near the absorption transition wavelength of the plasma species of interest and, typically, the sawtooth waveform 330 is chosen so that the laser wavelength scan width is comparable to the linewidth of the spectral feature being monitored.

In one embodiment, the light detector 306 is a high-speed photodiode, and the laser frequency is locked to an individual rotational component of a vibration transition of the plasma species of interest to allow for sensitive detection even in the presence of high background electrical noise. In one embodiment, the locking scheme includes inputting a photodiode current 340 to a lock-in amplifier 342 along with a sinusoidal waveform 342 from the signal generator 336. The lock-in amplifier 342 usually provides the capability to apply the appropriate gain, filtering, and phase adjustment for phase-sensitive detection of the photodiode current 340 at, for example, the modulation frequency, f, or at a harmonic, nf. The output of the lock-in amplifier 342 is then digitized by an analog-to-digital converter 344 and analyzed by a computer 346.

In operation, the relative change in photodiode current 340 is used to determine a change in absorption and, thus, concentration of the plasma species of interest during the etching process. For example, using a laser operating at a nominal wavelength of 1.33 $\mu$m, a change in the relative concentration of HF in the reaction chamber 304 can be detected by the relative change in photodiode current 340 detected by the photodiode 306. The change in concentration of HF or other suitable etch byproduct, determined based on the endpoint-generating layer and the etchant gases, can be used as an indicator of the endpoint of the etch.

The absorption detection technique described above involves passing the light beam 322 through the plasma 320 once, i.e., a single-pass configuration. For enhanced sensitivity, the light beam 322 may be passed through the plasma 320 multiple times, i.e., a multi-pass (or white-cell) configuration. Many of these detection techniques are also discussed in publications such as "Sensitive plasma etching endpoint detection using tunable diode laser absorption spectroscopy by H. S. Sun, V. Patel, B. Singh, C. K. Ng, and E. A. Whittaker (Applied Physics Letters, Vol. 64, Issue 21, pp. 2279–2781) and "Near-infrared diode lasers monitor molecular species" by David E. Cooper and Ramon U. Martinelli (Laser Focus World, November 1992), all of which are incorporated by reference.

Figure 3B:
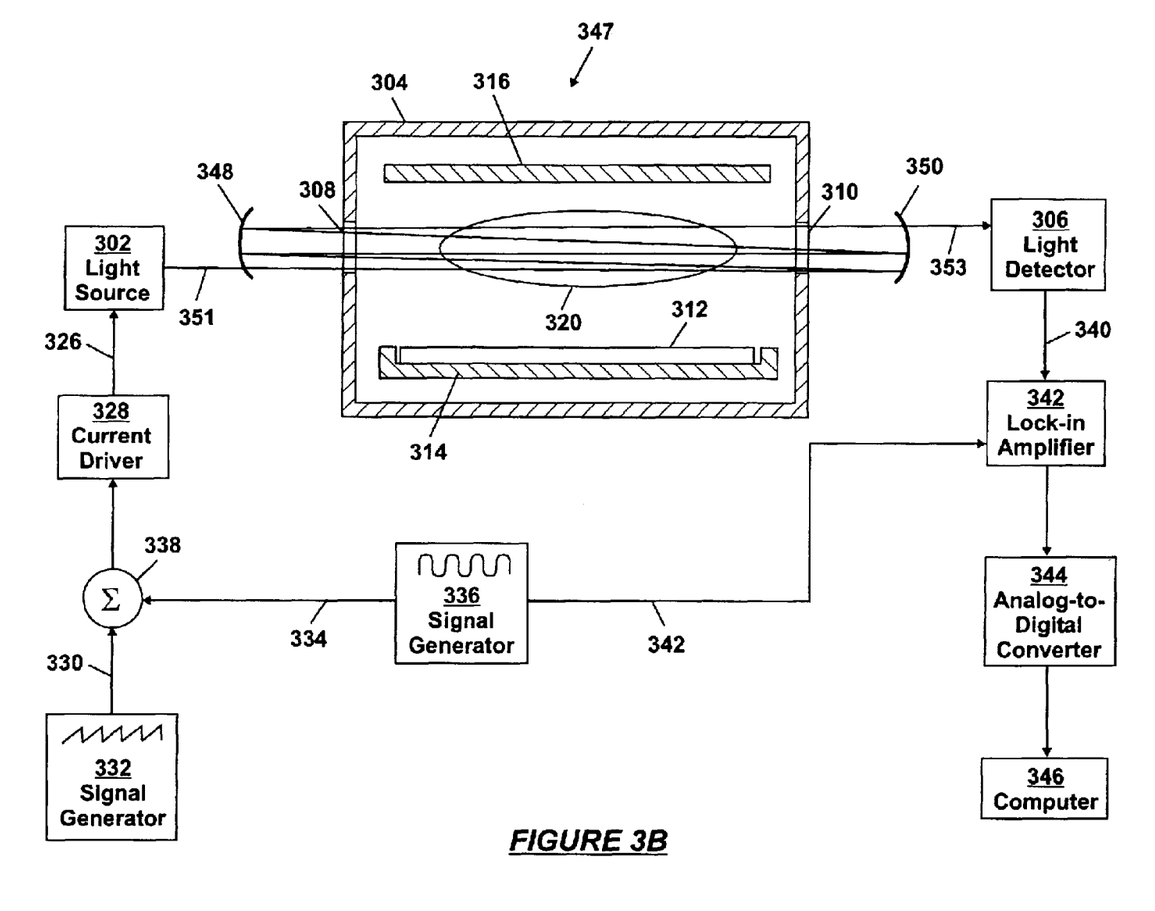
FIG. 3B is a schematic of an etch system equipped with a multi-pass direct on measurement apparatus according to an embodiment of the invention.

FIG. 3B shows an etching system 347 wherein two multi-pass mirrors 348, 350 are mounted outside the reaction chamber 304 in a diametrically-opposed fashion. The mirrors 348, 350 are mounted outside the reaction chamber 304 to avoid contamination of the wafer 312 during the etching process. The laser diode 302 directs a laser beam 351 to the mirror 348. The laser beam 351 passes through the mirror 348 and bounces back and forth between the mirrors 348, 350. The laser beam 351 passes through the plasma 320 as it bounces back and forth between the mirrors 348, 350. A portion of the laser beam 351 exits the mirror 350 with each roundtrip. The transmitted laser beam, indicated at 353, is detected by the photodiode 306 after the laser beam 351 makes a predetermined number of passes through the plasma 320.

Figure 3C:
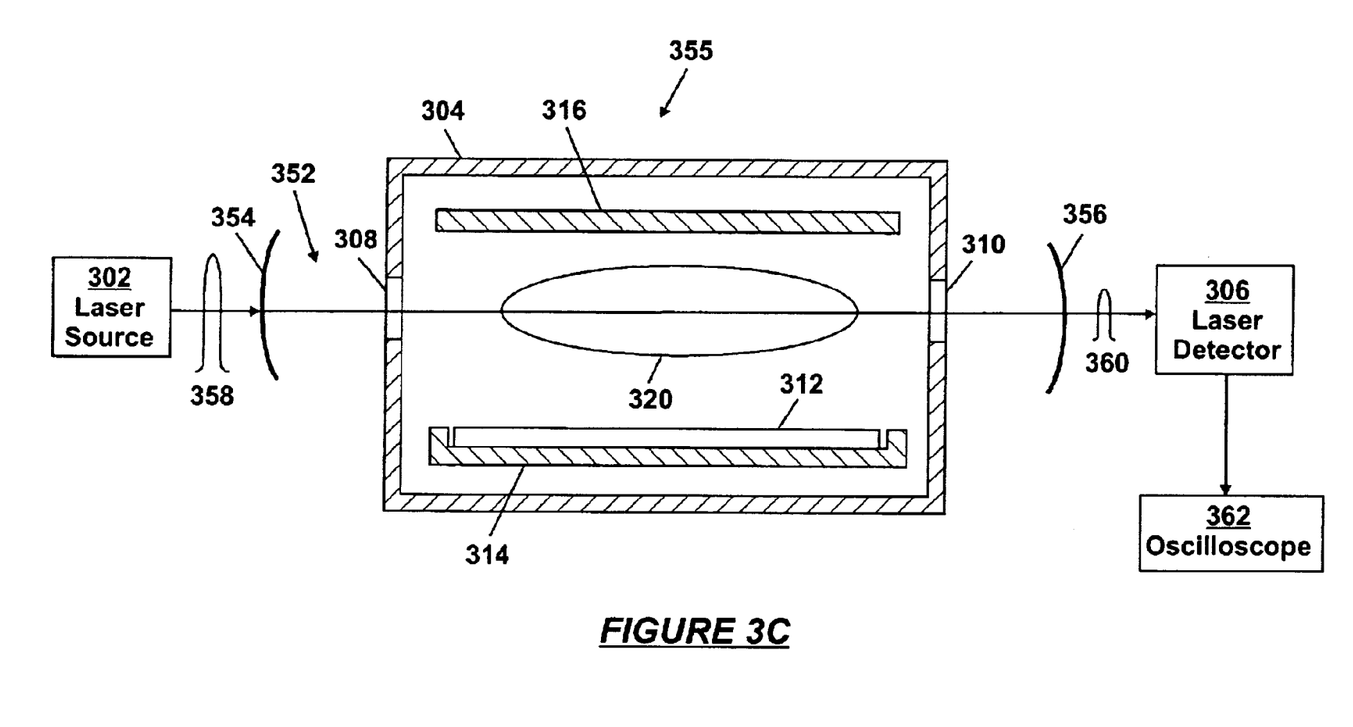
FIG. 3C is a schematic of an etch system equipped with a cavity ring-down on measurement apparatus.

FIG. 3C illustrates another etching system 355 wherein the reaction chamber 304 is disposed in an optical cavity 352, which is formed by diametrically-opposed, highly-reflective concave mirrors 354, 356. In operation, the light source 302 injects a laser beam 358 into the optical cavity 352 at a wavelength near the absorption transition wavelength of the plasma species of interest. Typically, the laser beam 358 is injected into the optical cavity 352 at a selected repetition rate to continuously monitor the evolution of a plasma species interest until the endpoint of the etch is detected. The laser beam 358 bounces back and forth between the mirrors 354, 356 many times until its intensity decays. Alternatively, chamber window 308 and/or chamber window 310 may include a reflective coating on the internal surfaces to serve the purpose of illustrated mirror 354 and/or mirror 356. The laser beam 358 passes through the reaction chamber 304 and plasma 320 during each roundtrip between the mirrors 354, 356. A portion of the laser beam 358 in the optical cavity 352 is transmitted through the mirror 356 with each roundtrip of the laser beam 358 and is detected by the light detector 306. The transmitted beam, indicated at 360, is displayed on an oscilloscope 362.

The time required for the intensity of the transmitted beam 360 to decay to 1/e of the intensity of the injected beam 358 is known as the "ring-down time" of the optical cavity 352. The cavity ring-down time is a function of the length of the optical cavity 352, the roundtrip transit time of the laser beam 358, the magnitude of the intrinsic cavity losses, and the absorption of the plasma species of interest. By measuring the cavity ring-down time, the absorption of the plasma species of interest can be determined. The accuracy with which the cavity ring-down time is measured is sensitive to the intrinsic cavity losses. Therefore, it is important that the optical cavity 352 forms a stable resonator, e.g., by optically-matching the various embedded optical cavities.

In yet another embodiment, the frequency modulated spectroscopy technique may be used to generate an endpoint signal from a "conventional" etch stop layer when performing a trench etch, and more particularly a dielectric trench etch in a plasma etcher. The use of frequency modulated spectroscopy on a conventional etch stop layer improves detection sensitivity in many cases, ensuring that the etching stops when intended with higher throughput.

As mentioned, the rate of absorption of HF or CO may be measured and employed to generate an endpoint signal when etching through an overlying layer. Note that in some cases, it is not necessary to etch into the underlying layer (but such underlying layer may be etched if desired) to obtain an endpoint signal since the surface area of the overlying layer that is exposed to the etchant would be reduced when the overlying layer is etched through, thereby changing the composition of the etch byproducts generated. This change in the etch byproduct composition may then be employed to generate an endpoint signal. In this case, the underlying layer may represent any layer that is different from the overlying layer as long as the presence of the underlying layer can cause a detectable change in the etch byproduct when the etchant employed to etch the overlying layer etches through the overlying layer. Thus the provision of a separate endpoint generating layer, although possible, is not absolutely necessary in these situations.

For example, certain dual damascene layer stacks may employ a $SiO_2$ overlying layer disposed above a TEOS or BPSG layer. The trench would be etched in the $SiO_2$ layer while a via may be formed in the TEOS or BPSG layer, for example. In this case, the concentration of HF or CO would change when the overlying $SiO_2$ layer is etched through, thereby triggering the generation of an endpoint signal. Of course the change in the absorption rate due to the changing concentration of HF or CO when the etch proceeds into the underlying TEOS or BPSG layer may also be employed to generate the endpoint signal, if desired.

As another advantageous application example, the absorption rate of HF (or CO) may be monitored to generate an endpoint signal in a low-κ dual-damascene application, such as the case when a low-κ layer is disposed above another layer. As an example, some dual damascene applications may involve an OSG layer (low-κ) is disposed above a FSG layer (slightly higher κ than the OSG layer). In this case, a trench may be formed in the OSG layer, while the via would be disposed in the FSG layer. This arrangement is feasible since the line-to-line capacitance at a given level may be more significant than the level-to-level capacitance (due to the smaller line-to-line spacing). By monitoring either the absorption rate based on the concentration of CO or HF, it is possible to detect when one layer (e.g., OSG) is etched through, or when the etch proceeds into an underlying layer (e.g., FSG). OSG is provided as one example of a low-κ material although another suitable low-κ material may well be employed. Likewise, FSG is provided as one example of a layer within which the via of the dual-damascene is formed, although another suitable layer may well be employed.

As can be appreciated from the foregoing, the invention provides numerous advantages. One key advantage stems from the use of an endpoint-generating layer, which does not have to have the selectivity and/or thickness requirement of an etch stop layer, in generating an endpoint signal. The use of such an endpoint-generating layer is advantageous because such endpoint-generating layer can be designed such that there is little perturbation in the overall κ value and/or other electrical and/or chemical characteristic of the film stack. This is especially useful in dual damascene integration, where an increase in the overall κ of a dielectric film stack can compromise the stack's ability to mitigate electrical delays.

Another key advantage is flexibility in selecting the thickness of the endpoint-generating layer since the endpoint-generating layer is not required to compensate for over-etch. This is particularly advantageous in modem, high density IC applications where features are increasingly scaled with narrower design rules, and thinner film stacks facilitate such high density applications. As long as the chosen detection technique and/or equipment can detect the change during etching, the thickness of the endpoint-generating layer and/or the difference between the etched layer and the endpoint-generating layer may be as minimal as desired.

Furthermore, it may cost less to provide the endpoint-generating layer. A lower cost material than the etch stop layer material may be employed and/or the process to dope or deposit the endpoint-generating layer may be less costly. In some cases, fewer steps are required to create the endpoint-generating layer compared to the number of steps required to deposit the etch stop layer. Thus, the resultant circuit may be created in a shorter amount of time and/or with less cost.

While the invention has been described in terms of several preferred embodiments, there are alterations, permutations, and equivalents which fall within the scope of this invention. It is therefore intended that the following appended claims be interpreted as including all such alterations, permutations, and equivalents as fall within the true spirit and scope of the invention.

What is claimed is:

1. A method for controlling a plasma etch process in a plasma processing chamber, comprising:
   introducing a substrate having thereon a layer stack into said plasma processing chamber, said layer stack including a first layer disposed above an end-point generating layer;
   etching through said first layer and at least partially through said end-point generating layer while monitoring an absorption rate of a light beam traversing an interior portion of said plasma processing chamber, wherein said endpoint generating layer is selected from a material that produces a detectable change in said absorption rate when etched, said end-point generating layer being characterized by at least one of a first characteristic and a second characteristic, said first characteristic being an insufficient thickness to function as an etch stop layer for said etching, said second characteristic being an insufficient selectivity to etchants employed to etch through said first layer to function as said etch stop layer; and
   generating an end-point signal upon detecting said detectable change.

2. The method of claim 1 wherein said first layer is formed from a low-κ material, said end-point generating layer is formed from an end-point generating layer material having a lower κ value than a κ value associated with said low-κ material of said first layer.

3. The method of claim 1 wherein said first layer is formed from a low-κ material, said end-point generating layer is formed from an end-point generating layer material having a substantially similar κ value to a κ value associated with said low-κ material of said first layer.

4. The method of claim 1 wherein said first layer is formed from a low-κ material, said end-point generating layer is formed from an end-point generating layer material having a higher κ value than a κ value associated with said low-κ material of said first layer.

5. The method of claim 1 wherein said low-κ material of said first layer has κ value between 1.8 to 3.7, inclusive.

6. The method of claim 1 wherein an end-point generating layer material of said end-point generating layer is slightly different in stoichiometry compared to a first layer material of said first layer, said end-point generating layer material being selected to produce said detectable change when etched without substantially deviating from one of an electrical characteristic and a chemical characteristic of said first layer material.

7. The method of claim 1 wherein a chemical composition of an end-point generating layer material of said end-point generating layer is the same as a chemical composition of a first layer material of said first layer except that at least one isotope of at least one element in said chemical composition of said end-point generating layer material is enriched in said end-point generating layer, a concentration of said one isotope being sufficient to produce said detectable change when said end-point generating layer is etched.

8. The method of claim 7 wherein said one element is carbon (C) and said one isotope is $^{13}C$.

9. The method of claim 7 wherein said one element is hydrogen (H) and said at least one isotope is deuterium H.

10. The method of claim 7 wherein said one element is oxygen (O) and said one isotope is one of oxygen-17 ($^{17}O$) and oxygen-18 ($^{18}O$).

11. The method of claim 7 wherein said one element is silicon (Si) and said one isotope is one of silicon-29 ($^{29}Si$) and silicon-30 ($^{30}Si$).

12. The method of claim 1 wherein a chemical composition of an end-point generating layer material of said end-point generating layer is different from a chemical composition of a first layer material of said first layer, said chemical composition of said end-point generating layer being selected to produce said detectable change when etched without substantially deviating from one of an electrical characteristic and a chemical characteristic of said first layer material.

13. The method of claim 1 wherein said detecting employs a direct absorption measurement technique.

14. The method of claim 13 wherein said detecting employs a multi-pass configuration.

15. The method of claim 13 wherein said detecting employs a single-pass configuration.

16. The method of claim 1 wherein said detecting employs frequency-modulated specstroscopy.

17. The method of claim 1 wherein said detecting employs wavelength-modulated specstroscopy.

18. The method of claim 1 wherein said monitoring employs Fourier Transform Infrared Specstroscopy.

19. The method of claim 1 wherein said detecting employs a cavity ring down technique.

20. The method of claim 1 wherein said first layer is formed from a low-κ fluorosilicate glass (FSG) material.

21. The method of claim 20 wherein said end-point generating layer is formed from an end-point generating layer material having a lower κ value than a κ value associated with said low-κ FSG material of said first layer.

22. The method of claim 20 wherein said end-point generating layer is formed from an end-point generating layer material having a substantially similar κ value to a κ value associated with said low-κ FSG material of said first layer.

23. The method of claim 20 wherein said end-point generating layer is formed from an end-point generating layer material having a higher κ value than a κ value associated with said low-κ FSG material of said first layer.

24. The method of claim 1 wherein said first layer is formed of low-κ organosilicate glass (OSG) material.

25. The method of claim 24 wherein said end-point generating layer is formed from an end-point generating layer material having a lower κ value than a κ value associated with said low-κ OSG material of said first layer.

26. The method of claim 24 wherein said end-point generating layer is formed from an end-point generating layer material having a substantially similar κ value to a κ value associated with said low-κ OSG material of said first layer.

27. The method of claim 24 wherein said end-point generating layer is formed from an end-point generating layer material having a higher κ value than a κ value associated with said low-κ FSG material of said first layer.

28. The method of claim 1 wherein said first layer is formed of a low-κ spin-on organic (SOO) material.

29. The method of claim 28 wherein said end-point generating layer is formed from an end-point generating layer material having a lower κ value than a κ value associated with said low-κ SOO material of said first layer.

30. The method of claim 28 wherein said end-point generating layer is formed from an end-point generating layer material having a substantially similar κ value to a κ value associated with said low-κ SOO material of said first layer.

31. The method of claim 28 wherein said end-point generating layer is formed from an end-point generating layer material having a higher κ value than a κ value associated with said low-κ FSG material of said first layer.

32. The method of claim 1 further comprising providing a light source for generating said light beam, said light beam being selected to have a wavelength approximating an absorption wave length of plasma species whose presence triggers said detectable change.

33. The method of claim 1 wherein said detectable change in said absorption rate is responsive to a change in a CO concentration in said interior portion of said plasma processing chamber.

34. The method of claim 1 wherein said detectable change in said absorption rate is responsive to a change in a HF concentration in said interior portion of said plasma processing chamber.

35. A substrate configured to be etched in a plasma processing chamber, comprising:
   a first layer, and
   an end-point generating layer disposed below said first layer, said end-point generating layer being selected from a material that produces a detectable change in an absorption rate of a light beam traversing an interior portion of said plasma processing chamber when said end-point generating layer is etched, said end-point generating layer being characterized by an insufficient thickness/selectivity combination to function as an etch stop layer for a plasma etch that also etches through said first layer.

36. The substrate of claim 35 wherein said first layer is formed from a low-κ fluorosilicate glass (FSG) material.

37. The substrate of claim 35 wherein said first layer is formed of low-κ organosilicate glass (OSG) material.

38. The substrate of claim 35 wherein said first layer is formed of a low-κ spin-on organic (SOO) material.

39. The substrate of claim 35 wherein said first layer is formed of low-κ material, said low-κ material having a κ value between 1.8 and 3.7, inclusive.

40. The substrate of claim 35 wherein an end-point generating layer material of said end-point generating layer is slightly different in stoichiometry compared to a first layer material of said first layer, said end-point generating layer material being selected to produce said detectable change when etched without substantially deviating from one of an electrical characteristic and a chemical characteristic of said first layer material.

41. The substrate of claim 35 wherein a chemical composition of an end-point generating layer material of said end-point generating layer is the same as a chemical composition of a first layer material of said first layer except that at least one isotope of at least one element in said chemical composition of said end-point generating layer material is enriched in said end-point generating layer, a concentration of said one isotope being sufficient to produce said detectable change when said end-point generating layer is etched.

42. The substrate of claim 41 wherein said one element is carbon (C) and said one isotope is $^{13}C$.

43. The substrate of claim 41 wherein said one element is hydrogen (H) and said at least one isotope is deuterium $^{2}H$.

44. The substrate of claim 41 wherein said one element is oxygen (O) and said one isotope is one of oxygen-17 ($^{17}O$) and oxygen-18 ($^{18}O$).

45. The substrate of claim 41 wherein said one element is silicon (Si) and said one isotope is one of silicon-29 ($^{29}Si$) and silicon-30 ($^{30}Si$).

46. The substrate of claim 41 wherein a chemical composition of an end-point generating layer material of said end-point generating layer is different from a chemical composition of a first layer material of said first layer, said chemical composition of said end-point generating layer being selected to produce said detectable change when etched without substantially deviating from one of an electrical characteristic and a chemical characteristic of said first layer material.

47. The substrate of claim 35 wherein said detectable change in said absorption rate is responsive to a change in a CO concentration in said interior portion of said plasma processing chamber.

48. The substrate of claim 35 wherein said detectable change in said absorption rate is responsive to a change in a HF concentration in said interior portion of said plasma processing chamber.

49. In a plasma processing chamber, a method for etching through a low-κ layer of a layer stack, said low-κ layer being disposed above an end-point generating layer, said method comprising:
   introducing a substrate having thereon said layer stack into said plasma processing chamber;
   generating a light beam that traverses an interior portion of said plasma processing chamber;
   etching through said layer stack, including said low-κ layer, while monitoring an absorption rate of said light beam by a direct absorption measurement technique, wherein said end-point generating layer is selected from a material that produces a detectable change in said absorption rate when etched, said end-point generating layer being characterized by an insufficient thickness/selectivity combination to function as an etch stop layer for said etching; and
   generating an end-point signal upon detecting said detectable change.

50. The method of claim 49 wherein an end-point generating layer material of said end-point generating layer is slightly different in stoichiometry compared to a low-κ layer material of said low-κ layer.

51. The method of claim 50 wherein said end-point generating layer material has a lower κ value than a κ value associated with said low-κ material of said low-κ layer.

52. The method of claim 50 wherein said end-point generating layer material has a κ value that substantially equals to a κ value of said low-κ material.

53. The method of claim 50 wherein said end-point generating layer material has a higher κ value than a κ value associated with said low-κ material of said low-κ layer.

54. The method of claim 49 wherein a chemical composition of an end-point generating layer material of said end-point generating layer is the same as a chemical composition of a low-κ layer material of said low-κ layer except that at least one isotope of at least one element in said chemical composition of said end-point generating layer material is enriched in said end-point generating layer, a concentration of said one isotope being sufficient to produce said detectable change when said end-point generating layer is etched.

55. The method of claim 54 wherein said one element is carbon (C) and said one isotope is $^{13}$C.

56. The method of claim 54 wherein said one element is hydrogen (H) and said at least one isotope is deuterium $^2$H.

57. The method of claim 54 wherein said one element is oxygen (O) and said one isotope is one of oxygen-17 ($^{17}$O) and oxygen-18 ($^{18}$O).

58. The method of claim 54 wherein said element is silicon (Si) and said at least one of isotopes of said element is one of silicon-29 ($^{29}$Si) and silicon-30 ($^{30}$Si).

59. The method of claim 49 wherein a chemical composition of an end-point generating layer material of said end-point generating layer is different from a chemical composition of a low-κ layer material of said low-κ layer, said chemical composition of said end-point generating layer being selected to produce said detectable change when etched.

60. The method of claim 59 wherein said end-point generating layer material has a lower K value than a κ value associated with said low-κ material of said low-κ layer.

61. The method of claim 59 wherein said end-point generating layer material has a κ value that substantially equals to a κ value of said low-κ material.

62. The method of claim 59 wherein said end-point generating layer material has a higher κ value than a κ value associated with said low-κ material of said low-κ layer.

63. The method of claim 49 wherein said low-κ layer is formed from a low-κ fluorosilicate glass (FSG) material.

64. The method of claim 49 wherein said low-κ layer is formed of low-κ organosilicate glass (OSG) material.

65. The method of claim 49 wherein said low-κ layer is formed of a low-κ spin-on organic (SOO) material.

66. The method of claim 49 wherein said plasma processing chamber represents a capacitively-coupled plasma processing chamber.

67. The method of claim 49 wherein said plasma processing chamber represents an inductively-coupled plasma processing chamber.

68. The method of claim 49 wherein said plasma processing chamber represents an microwave plasma processing chamber.

69. The method of claim 49 wherein said low-κ layer is formed of a material having a κ value between 1.8 and 3.7, inclusive.

70. The method of claim 49 wherein said detectable change in said absorption rate is responsive to a change in a CO concentration in said interior portion of said plasma processing chamber.

71. The method of claim 49 wherein said detectable change in said absorption rate is responsive to a change in a HF concentration in said interior portion of said plasma processing chamber.

72. A method for controlling a plasma etch process in a plasma processing chamber, comprising:

introducing a substrate having thereon a layer stack into said plasma processing chamber, said layer stack including a first layer disposed above a second layer;

etching through said first layer while monitoring an absorption rate of a light beam traversing an interior portion of said plasma processing chamber, wherein said second layer is formed of a second layer material that is sufficiently different from a first layer material of said first layer so as to result in a detectable change in said absorption rate when said first layer is etched through; and generating an end-point signal upon detecting said detectable change.

73. The method of claim 72 wherein said first layer is a low-κ layer.

74. The method of claim 73 wherein said first layer material is OSG.

75. The method of claim 74 wherein said second layer material is FSG.

76. The method of claim 73 wherein said detectable change in said absorption rate is responsive to a change in a CO concentration in said interior portion of said plasma processing chamber.

77. The method of claim 73 wherein said detectable change in said absorption rate is responsive to a change in a HF concentration in said interior portion of said plasma processing chamber.

78. The method of claim 72 wherein said first layer material is a low-κ material, said second layer material having a lower κ value than a κ value associated with said first layer material.

79. The method of claim 72 wherein said first layer material is a low-κ material, said second layer material having a substantially similar κ value to a κ value associated with said first layer material.

80. The method of claim 72 wherein said first layer material is a low-κ material, said second layer material having a higher κ value than a κ value associated with said first layer material.

81. The method of claim 72 wherein said detectable change in said absorption rate is responsive to a change in a CO concentration in said interior portion of said plasma processing chamber.

82. The method of claim 72 wherein said detectable change in said absorption rate is responsive to a change in a HF concentration in said interior portion of said plasma processing chamber.

83. The method of claim 72 wherein said detecting employs a direct absorption measurement technique.

84. The method of claim 83 wherein said detecting employs a multi-pass configuration.

85. The method of claim 83 wherein said detecting employs a single-pass configuration.

86. The method of claim 72 wherein said detecting employs frequency-modulated specstroscopy.

87. The method of claim 72 wherein said detecting employs wavelength-modulated specstroscopy.

88. The method of claim 72 wherein said monitoring employs Fourier Transform Infrared Specstroscopy.

89. The method of claim 72 wherein said detecting employs a cavity ring down technique.

90. The method of claim 72 wherein said plasma etch process is part of a dual-damascene process, said first layer being configured to accommodate a trench of said dual-damascene process, said second layer being configured to accommodate a via of said dual-damascene process.

* * * * *